United States Patent [19]

Sheffield

[11] 4,079,437
[45] Mar. 14, 1978

[54] MACHINE AND METHOD FOR POLING FILMS OF PYROELECTRIC AND PIEZOELECTRIC MATERIAL

[75] Inventor: William F. Sheffield, Oakdale, Minn.

[73] Assignee: Minnesota Mining and Manufacturing, St. Paul, Minn.

[21] Appl. No.: 681,895

[22] Filed: Apr. 30, 1976

[51] Int. Cl.² .......................... H05F 1/02; H05F 3/02
[52] U.S. Cl. .................................. 361/233; 29/25.35
[58] Field of Search ...................... 317/262 A, 262 E; 307/88 ET; 29/592 E, 592, 25.53, 573; 361/230, 233

[56] References Cited

U.S. PATENT DOCUMENTS

| | | | |
|---|---|---|---|
| 2,648,097 | 8/1953 | Kritchever | 317/262 A |
| 3,521,126 | 7/1970 | Granzow et al. | 317/262 A |
| 3,885,301 | 5/1975 | Murayama | 317/262 E |
| 3,899,969 | 8/1975 | Taylor | 317/262 A |
| 3,985,914 | 10/1976 | Sasaki et al. | 29/592 |

OTHER PUBLICATIONS

Journal of Polymer Science "Persistent Polarization in Polyvinylidene Fluoride" by Murayama et al. vol. 13, May, 1975, pp. 1033–1047.
Applied Physics Letters "Room-Temp. Poling & Morphology Changes in Pyroelectric PVF" by Southgate, vol. 28, No. 5, Mar. 1, 1976, pp. 250 to 252.
Applied Physics Letters, vol. 24, No. 10, May 15, 1974, pp. 456–458.
Journal of Applied Physics, vol. 44, No. 5, May 1973, pp. 2064–2071.

*Primary Examiner*—Gerald Goldberg
*Attorney, Agent, or Firm*—Cruzan Alexander; Donald M. Sell; Walter N. Kirn

[57] ABSTRACT

An apparatus and method for rapidly and continuously poling a film of polymeric material exhibiting at least one of pyroelectric and piezoelectric characteristics to yield a poled film having a high coefficient of at least one of pyroelectric and piezoelectric properties, and a high degree of uniformity of polarization throughout its thickness. The method of the present invention includes applying an electric field greater than 1000 K volts/cm across the film for less than 180 seconds. The apparatus of the present invention includes a drive for advancing the film and a pair of electrodes that establish an electric field across the film. In a first embodiment, a hot poling roller serves as a high voltage electrode and a grounded roller contacts a conductive layer coated on the other side of the film to provide the second electrode. In a second embodiment both electrodes are provided by hot poling rollers with one being connected to a high voltage potential and the other to ground potential. Both embodiments utilize ambient air to cool the film while such pyroelectric and piezoelectric properties exist in the film. A third embodiment is similar to the first except that the hot poling roller of the first embodiment is a cold poling roller and a radiant source heats the film during poling. In all three embodiments the high voltage electrode is separated from direct physical contact with the film by a resistive layer in order to avoid serious damage to the film due to electrical arcing that can occur through a defective or thinner than normal area of the film.

26 Claims, 4 Drawing Figures

MACHINE AND METHOD FOR POLING FILMS OF PYROELECTRIC AND PIEZOELECTRIC MATERIAL

CROSS REFERENCE TO RELATED APPLICATION

U.S. Patent application Ser. No. 479,663 filed by applicant and another on June 17, 1974, describes an apparatus and process for continuously poling a thin film of pyroelectric and/or piezoelectric material. Such apparatus includes a drive for advancing the film, a hot poling roller having a current limiting layer thereon for applying a first electric potential and heat to one side of the film, an electrically grounded roller adapted for contacting a conductive layer carried on the other side of the film for applying a second electric potential to the film such that the first and second electric potentials apply an electric field across the film, and a cold roller located adjacent the hot poling roller and on the opposite side of the film such that the film contacts the cold roller and is cooled thereby prior to leaving contact with the hot poling roller and the electric field maintained thereby. The apparatus and method disclosed in the "663" application involves the advancement of the film through such apparatus while subjecting the film to an electric field of 1000 K volts/cm for a period of 10 minutes while maintaining the film at a temperature of 120° C.

BACKGROUND OF THE INVENTION

1 Field of the Invention

The present invention relates in general to the poling of polymeric film materials that exhibit at least one of pyroelectric and piezoelectric properties, and in one aspect relates to the continuous poling of such film materials.

2 Description of the Related Art

Several polymeric film materials exhibit both pyroelectric and piezoelectric properties. However, some polymeric film material may exhibit only one of such properties.

The pyroelectric and/or piezoelectric property of polymeric film materials is commonly referred to as being caused by an arrangement of the dipoles of the film. Normally the dipoles of pyroelectric and/or piezoelectric polymeric films are essentially arranged in random fashion. However, such randomly arranged dipoles can be rearranged into a poled orientation by heating the film above a particular temperature, known as the poling temperature, and concurrently applying an electric field across the film. Once the film is poled and cooled below the poling temperature, the electric field may be removed and the dipoles will remain substantially as orientated by the field to yield film with desirable pyroelectric and/or piezoelectric properties. However, if the poled film is again heated above its poling temperature for an extended period thereafter, the dipoles will return to substantially random orientation.

It is generally known that the degree of dipole orientation that results from such a poling process is a function of the temperature to which the film is heated, the magnitude of the applied electric field and the length of time such electric field is applied while the film is heated above the poling temperature. For example, substantial poling occurs in a film of polyvinylidene fluoride when it is heated to a temperature of 90° C and an electric field of 400 K volts/cm is applied across the film for 10 minutes. In general terms, increasing the temperature, the electric field magnitude, and/or the poling time will progressively increase the degree of poling achieved up to a maximum.

The art describes poling of pyroelectric and/or piezoelectric films in non-continuous modes. For example, U.S. Pat. No. 3,878,274 indicates that polyvinylidene fluoride film can be poled by placing electric fields of 50 K volts/cm to 2000 K volts/cm across the film at temperatures between 40° C and 150° C. However, such patent contains no detailed teaching of the particular magnitude of electric field that is used at a particular temperature. Accordingly, since the electric field strength that films can stand without breakdown and arcing therethrough is directly related to the temperature of the sheet of film being poled, it is not apparent from such patent how to create an improved apparatus and/or process for poling. The examples given in the U.S. Pat. No. 3,878,274 patent pole at 700 K volts/cm at 90° C for 30 minutes, 400 K volts/cm at 90° C for 30 minutes, and 200 K volts/cm at 150° C for apparently 30 minutes also.

An Applied Physics Letters article entitled "Effects of Poling Conditions on Responsivity and Uniformity of Polarization of $PVF_2$ Pyroelectric Detectors" (Vol. 24; No. 10; May 15, 1974) indicates that the uniformity of polarization through the thickness of polyvinylidene fluoride ($PVF_2$) film material is related to the responsivity of the poled material. The article also points out that very uniformly poled material can be obtained by poling at 2100 K volts/cm at 70° C for 5 minutes, but does not indicate the rate of material breakdown experienced. Furthermore, the article states that increased temperature and voltage tend to make polarization more uniform; and that increased poling time likewise tends to make polarization more uniform.

Other art has indicated poling results for short periods of time in the seconds range and compared this data to data for longer periods of time in the several minutes range using the same poling temperature and electric field magnitude. A Journal of Applied Physics article entitled "Pyroelectricity in Polyvinylidene Fluoride" (Vol. 44; No. 5; May, 1973) indicates in FIG. 10 that the magnitude of polarization achieved by the use of short poling periods is only a fraction of the magnitude achieved for long poling periods.

SUMMARY OF THE INVENTION

The present invention provides an apparatus and process for poling a film of polymeric material in short periods of time to yield a high coefficient of at least one of pyroelectric and piezoelectric properties, and a high degree of uniformity of polarization through the thickness of the material. Such results are obtained according to the present invention by applying an electric field greater than 1000 K volts/cm across the thickness of the film for less than 180 seconds to quasi-permanently pole the material.

A poling apparatus according to the present invention includes a first means for applying an electric potential to one side of the film and a second means for applying a second electric potential to the opposite side of the film. The first and second means establish an electric field greater than 1000 K volts/cm across a portion of the film for providing moderate coefficients of at least one of pyroelectric and piezoelectric properties in such portion. A drive means continuously advances the film past the first and second electric potential means at such speed that the electric field is applied across a portion of the film for less than 180 seconds.

Preferably, however, the present invention utilizes still larger magnitudes of electric field for shorter periods of time. Such preferred ranges are an electric field greater than 1400 K volts/cm for less than 60 or 30 seconds, and an electric field greater than 2000 K volts/cm for less than 10 seconds or 1 second.

Moderate coefficients of pyroelectric and piezoelectric properties according to the present invention are those that are at least 50% of the maximum obtainable by steady state poling. Such maximum obtainable by steady state poling is defined as the typical maximum coefficient of pyroelectric and piezoelectric properties obtained for a similar piece of the same film material and is determined by coating a conductive electrode on each side of the film and then placing a constant electric field magnitude across the thickness of the film for 60 minutes. The magnitude of the constant electric field during the steady state poling should be near the dielectric breakdown strength of the film for 60 minutes and the film should be at the same temperature as the film poled according to the present invention.

Preferably, the present invention provides considerable coefficients of at least one of the pyroelectric and piezoelectric properties; and more preferably, the present invention provides substantial coefficients of at least one of the pyroelectric and piezoelectric properties. Considerable and substantial coefficients of poling are respectively defined as being at least 70 percent and at least 90 percent of the maximum obtainable by steady state poling. Material poled according to the present invention, however, often has a poling coefficient greater than 100% of the maximum obtainable by steady state poling.

The preferred embodiments of the present invention include a current limiting means between the second voltage potential means and the adjacent side of the film. Such current limiting means limits the damage due to electrical arcing that may occur should the film dielectrically break down.

In general terms, by decreasing the time the electric field is across the film and increasing the electric field, the present invention can provide more desirable poling results, such as an increase in the pyroelectric and piezoelectric coefficient and uniformity of polarization. Relatively speaking, at short poling times, higher magnitudes of electric field can be placed across the film without dielectric break down. It is believed that higher magnitudes of electric field cause higher forces on the components of the material responsible for producing the pyroelectric and piezoelectric properties to result in poling of the material in very short periods of time.

Optimization of the degree of poling at the decreased poling times of the present invention appears to involve the interrelationship of time in the electric field, electric field magnitude and the temperature of the film. Relatively speaking, over some range of temperatures the same pyroelectric or piezoelectric coefficient can be obtained according to the present invention by raising the temperature of the film and using a lower electric field for the same period of time. In general, over some range of temperatures individually raising the temperature of the film, increasing the electric field across the film and increasing the period of time in the electric field all tend to increase the magnitude of poling according to the present invention. However, these parameters in combination are related to the dielectric strength at which the film customarily breaks down. It therefore follows that more desirable poling results as these parameters are varied in combination to the point of approaching dielectric breakdown of the material. For example, experimental results show that excellent poling is done with polyvinylidene fluoride film being in the electric field for less than 10 seconds.

As previously described, film temperature is one of the parameters which can be varied. Therefore, the preferred embodiments of the present invention also include various apparatus that provide heat for concurrently raising the temperature of at least a segment of the portion of the film while the electric field is across such portion. Such feature is not essential to the present invention, however, as the film can be poled at room temperature.

In a first preferred embodiment, the first electric potential means is provided by a cylindrical roller having a grounded electrically conductive surface adapted for contacting a layer of conductive material carried on one side of the film. The second electric potential means of this embodiment is a temperature controlled cylindrical roller having an electrically conductive surface on which there is a current limiting layer that contacts the opposite side of the film.

A second preferred embodiment differs from the first by having a first electric potential means provided by a temperature controlled cylindrical roller with a grounded electrically conductive surface adapted to contact one side of an uncoated film.

A third preferred embodiment differs from the first by having an infrared lamp shine on the film to heat it. Such lamp replaces the heat provided by the cylindrical roller of the second electric potential means of the first embodiment.

DESCRIPTION OF THE PREFERRED EMBODIMENTS

Figure 1:
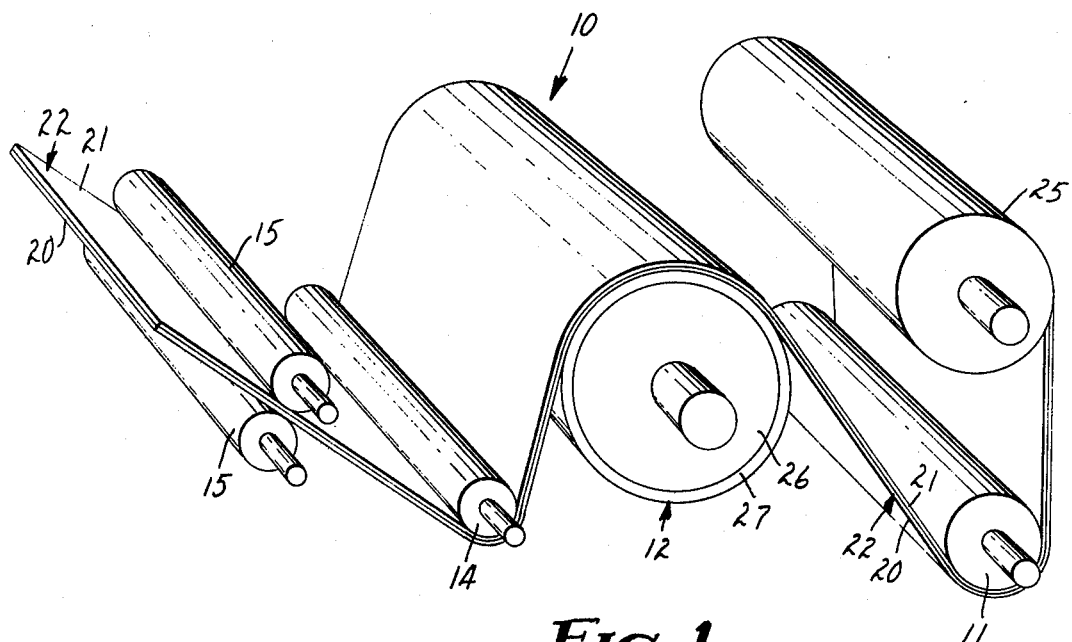
FIG. 1 is a perspective view of a first embodiment of a poling machine according to the present invention through which a coated sheet of polymeric film is disposed.
Figure 2:
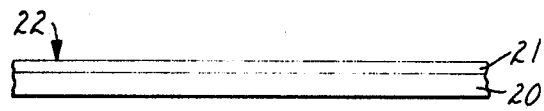
FIG. 2 is an enlarged fragmentary cross-sectional view of the coated film of FIG. 1.

Referring now to FIG. 1, a first embodiment of the present invention is shown in the form of a poling machine 10 that includes a preheat roller 11, a hot poling roller member 12, an electrically grounded roller 14 and a pair of drive rollers 15, all of which rollers are cylindrical in shape and mounted from side plates (not shown) of the machine 10. The poling machine 10 is adapted for poling a film 20 of polymeric material that can be poled to provide at least one of pyroelectric and piezoelectric properties, is highly electrically insulative and, as indicated most clearly in FIG. 2, is coated on one side with a relatively thin layer of electrically and thermally conductive material 21 such as aluminum, nickel or copper to form a composite sheet of film 22.

Referring back to FIG. 1, the composite sheet of film 22 is supplied to the machine 10 from a supply roll 25 and is threaded partially around the rollers 11, 12 and 14 and then through a nip between the drive rollers 15, which drive rollers serve as a drive means to advance the sheet 22 through the machine 10. A portion of the conductive layer 21 of the sheet 22 is maintained in physical contact with the roller 14 which has an electrically grounded conductive surface adapted for contacting a portion of the surface of the conductive layer 21 to effectively electrically ground the entire broad surface of the side of the film 20 carrying the layer 21. Thus, the roller 14 provides a first means for applying a first electric potential to one side of the film 20.

To more fully understand the operation of the present invention and the manner in which the film is poled, the following description is made with regard to a reference portion of the composite sheet 22 as such portion is advanced through the machine 10. Upon leaving the supply roll 25 the reference portion of the sheet 22 first partially winds around the preheat roller 11 such that the conductive layer 21 contacts the roller 11. The preheat roller 11 is heated, either electrically or in some other manner, to a temperature preferably over 120° C and is employed together with film tension for eliminating wrinkles in the sheet 22 to provide good poling along the length of the film 20. While the preheat roller 11 is not essential to the operation of the machine, elimination of wrinkles is very desirable. To further aid in controlling wrinkles in the sheet 22, additional film handling rollers (not shown) and drag brakes (not shown) may be used with the supply roll 25 to subject the sheet 22 to a predetermined desired tension.

Subsequent to leaving contact with the preheat roller 11, the reference portion of the sheet 22 moves to the hot poling roller member 12 and the exposed surface of the film 20 of the sheet 22 engages the outer cylindrical surface thereof. The member 12 includes an inner cylindrical roller 26 that is heated, either electrically or in some other manner, and has an electrically conductive surface that is biased to a high negative (or positive) DC voltage potential. A current limiting electrically resistive layer 27 overlays the cylindrical roller 26 of the member 12 and the film 20 rides over the layer 27 as the sheet 22 advances around the periphery of the member 12.

The electrically conductive cylindrical roller 26 serves the dual functions of heating the reference portion of the film 20 and also acting as a second means for applying a second electric potential to the film 20 to thereby coact with the first electric potential means in establishing an electric field across the sheet 22 to provide moderate coefficients of at least one of pyroelectric and piezoelectric properties in the film 20. Such first and second electric potential means are specifically adapted to apply and accurately control an electric field greater than 1000 K volts/cm across the film concurrently with the application of temperature controlled heat to the film by the roller 26 of the member 12.

The resistive layer 27 reduces the possibility for damage to the film 20 due to arcing therethrough resulting from a film defect or an area of film 20 that is thinner than normal. The layer 27 is preferably formed from elastomeric materials such as silicone rubber, but ceramic materials could also be employed. As such, the layer 27 provides a current limiting means between the first and second electric potential means in the form of an electrical resistance between such electrodes should the dielectric strength of any area of the film 20 be exceeded by the electric field previously described. Such resistance significantly aids in reducing damage to the film which would otherwise be caused by the energy dissipated by arcing through the film. However, the electrical resistance and capacitance of the layer 27 is selected such that, when combined with the dielectric resistance and capacitance of the film 20, the layer 27 will not interfere with the normal poling process.

The composite sheet 22 is continuously advanced through the machine 10 by the pair of drive rollers 15. The rollers 15 are driven at sufficient rotational speed to advance the sheet 22 through the machine 10 such that the aforementioned electric field is applied across the reference portion of the film 20 for less than 180 seconds, and preferably less than 60, 30, 10 or 1 seconds depending upon the magnitude of electric field applied and the temperature of the film. By moving the sheet 22 rapidly through the electric field according to the present invention it has been possible to significantly increase the electric field strength that the film 20 can withstand without breaking down. This in turn has resulted in not only a fast poling apparatus and process, but also in poling results that are the same or better than those obtained with apparatus and processes taking many times longer. Not only does the present invention produce a high pyroelectric and piezoelectric coefficient, but also it produces good uniformity of polarization throughout the thickness of the film 20.

When the reference portion of the sheet 22 leaves the hot poling roller member 12, it passes to the grounded roller 14 through the ambient air and is cooled by such air below the poling temperature while the dipoles are substantially held in alignment. It is believed that no special cooling means are necessary because the sheet 22 moves so rapidly away from the heat generated by the poling roller 26 that the reference portion of the film 20 is cooled below the poling temperature before the dipoles move out of alignment. Thereafter, the reference portion of the poled sheet 22 passes around the electrically grounded roller 14 and between the drive rollers 15 to a take-up roller (not shown).

As previously described, optimization of the degree of poling at the decreased times of the present invention appears to involve the interrelationship of time in the electric field, electric field magnitude and the temperature of the film. Once the time in the electric field and the temperature of the film while in the field are selected, the electric field is experimentally increased until it approaches the dielectric breakdown strength of the film. As the breakdown strength is approached, the film will occasionally break down due to nicks on the film surface or thinner than normal areas of film. The field is then reduced slightly until breakdown ceases. Of course, the dielectric breakdown strength of a given film also depends on the material from which it is made. However, regardless of the material from which the film is made, once the time in the electric field and the temperature of the film while in the field are selected, applying an electric field that approaches the dielectric breakdown strength should maximize the poling for that film.

Thus, the present invention provides a simple means for continuously poling materials which exhibit at least one of pyroelectric and piezoelectric properties to yield high coefficients of at least one of pyroelectric and piezoelectric properties and a high degree of uniformity of polarization.

Figure 3:
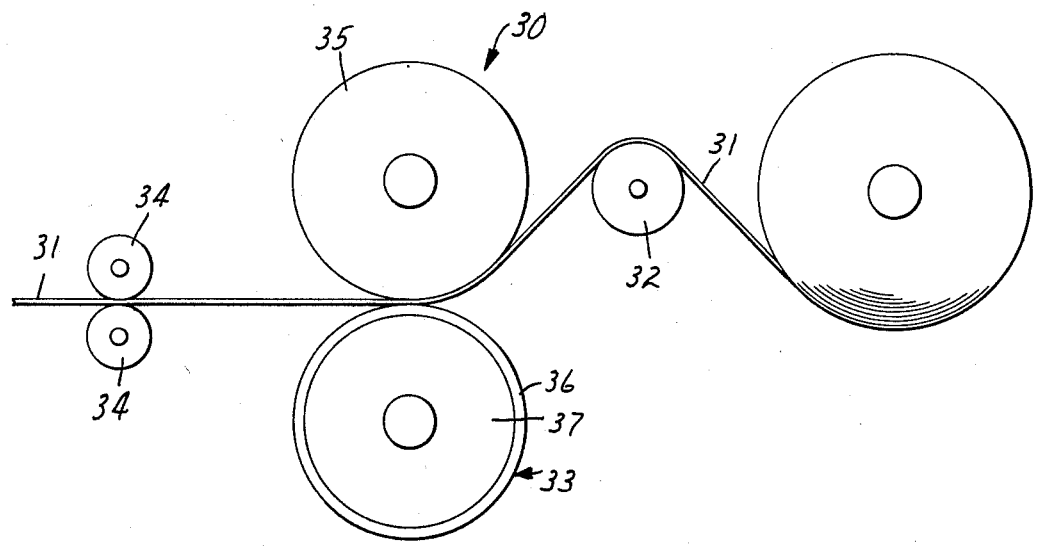
FIG. 3 is a diagrammatic side view of a second embodiment of a poling machine according to the present invention through which an uncoated sheet of polymeric film is disposed.

Although the use of the conductive layer 21 on the film 20 is employed with the machine 10, such conductive layer is not essential to the present invention as indicated by a second embodiment of the present invention, a machine 30, as shown in FIG. 3. The poling machine 30 is adapted to pole a polymeric film 31 that can be poled to provide at least one of pyroelectric and piezoelectric properties and has no conductive coating on either broad surface. The machine 30 includes a preheat roller 32, a hot poling roller member 33 and a pair of drive rollers 34 that are respectively similar to the rollers 11, 12 and 15 of the machine 10. However, the machine 30 differs from the machine 10 in that the first electric potential means is now a cylindrical roller 35 that is heated, has a grounded electrically conductive surface and is positioned adjacent the roller 33. While both the rollers 33 and 35 in the machine 30 provide heat to the film 31, such machine could operate with neither, or only one or the other of the rollers 33 and 35 heated.

The operation of the machine 30 resembles that of the machine 10. First, the film 31 is preheated by the roller 32 and tensioned to eliminate wrinkles. Then, the film 31 comes in contact with the grounded electrically conductive surface of the roller 35 and is heated to the proper predetermined poling temperature. Next, the film 31 passes through a nip between the roller 35 (first electric potential means) and the roller member 33. The member 33 includes an inner cylindrical roller 37 (second electric potential means) that is heated and has an electrically conductive surface. A current limiting electrically resistive layer 36, similar to the layer 27, overlays the roller 37 to form the roller member 33. The rollers 35 and 37 establish an electric field greater than 1000 K volts/cm across the film 31 as it passes therebetween. The drive rollers 34 advance the film rapidly through the electric field with the ambient air cooling the film 31 below the poling temperature while the dipoles thereof are still in alignment.

An advantage of the second embodiment is that it is possible to apply higher electric fields across the uncoated polymeric film 31 without a significant amount of film breakdown. With respect to embodiment 1, it is believed that the conductive coating 21 on the film 20 tends to fill in any nicks, grooves or other irregularities on the surface of the film and create high dielectric stress regions around such irregularities and hence the film tends to break down at lower electric field magnitudes.

Figure 4:
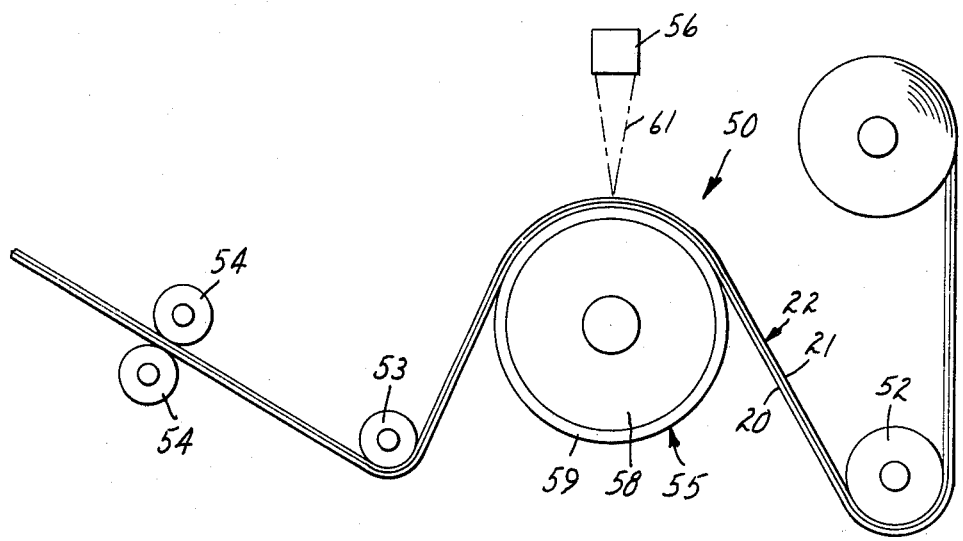
FIG. 4 is a diagrammatic side view of a third embodiment of a poling machine according to the present invention through which a coated sheet of polymeric film is disposed.

A third embodiment of the present invention, a machine 50 as shown in FIG. 4, is adapted to pole the film 20 which is coated on one surface with the conductive coating 21 to form the composite sheet 22 as shown in FIG. 2. The machine 50 includes a preheat roller 52, a grounded roller 53 and a pair of drive rollers 54 that are respectively similar to the rollers 11, 14 and 15 of the machine 10. However, the machine 50 differs from the machine 10 in that the second electric potential means is now part of a cold poling roller member 55 that is maintained at less than 80° C, and a radiant heat source 56 provides heat for raising the temperature of a segment of the film as it passes around the member 55.

The cold poling roller member 55 includes an inner cylindrical roller 58 having an electrically conductive surface that is cooled. A current limiting electrically resistive layer 59, similar to the layer 27, overlays the roller 58 to form the cold poling roller member 55.

The radiant heat source 56 is, for example, an infrared lamp which focuses a beam of radiation 61 upon the surface of the composite sheet 22 as it passes around the cold poling roller member 55.

The grounded roller 53 serves as the first electric potential means and the inner roller 58 of poling member 55 serves as the second electric potential means. The first and second electric potential means coact to establish the electric field greater than 1000 K volts/cm across the portion of the film 20 that is in contact with poling member 55. The radiant heat source 56 raises the temperature of a segment of such portion while the electric field is across such portion. As previously described, raising the temperature of the film 20 over some range of temperatures has the same general effect on poling as increasing the electric field across the film. It is believed such increase in temperature increases the internal energy of the components of the material that have the pyroelectric and piezoelectric properties such that they can be better oriented by the same electric field magnitude.

The operation of the machine 50 resembles that of the machine 10. First, a reference portion of the composite sheet 22 is preheated by the roller 52 under tension to eliminate wrinkles. Then, the reference portion of the film 20 of sheet 22 comes in contact with cold poling roller member 55 (less than 80° C) and is cooled thereby. As sheet 22 passes around member 55 the radiant heat source 56 provides heat for raising the temperature of at least a segment of the portion in contact with the member 55. As the sheet 22 leaves the influence of the heat source 56, it is cooled by the member 55. After the reference portion of the sheet 22 leaves the member 55, it passes around the cylindrical roller 53. The roller 53 has a grounded electrically conductive surface for contacting the conductive layer 21 that is carried on one surface of the film 20. Then, the reference portion passes between the drive rollers 54 to a take-up roller (not shown).

While the preferred embodiments of the present invention illustrate a continuous poling process, the concept of the invention is also applicable to non-continuous poling processes.

The following non-limiting examples are provided:

EXAMPLE 1

A 25 micrometer thick, 305 millimeter wide film 20 of biaxially orientated polyvinylidene fluoride (obtained from Kureha Chemical Co., Japan) was vapor coated with an approximately 60 nanometer thick aluminum layer 21 on one side and then fed through the poling machine 10 shown in FIG. 1. The preheat roller 11 was 95 millimeters in diameter and its temperature was held at approximately 135° C. The hot poling roller 12 included an inner roller 26 that was 140 millimeters in diameter and heated to approximately 105° C. The roller 26 was coated with a layer 27 of conductive rubber approximately 3 millimeters thick having an electrical resistivity of approximately $10^{10}$ ohm-cm. The electrically grounded roller 14 was 25 millimeters in diameter and the drive rollers 15 were 50 millimeters in diameter. The film was driven through the machine 10 at various discrete speeds with the electric field across the film and the temperature of the film being varied. The voltage across the film was measured by using ball bearing rollers that contacted the exposed surfaces of the rollers 12 and 14 and were connected to a high impedance voltmeter. The electric field was calculated by dividing such voltage measurement by the thickness of the film.

Table I shows tabulations of pyroelectric coefficients and uniformity of polarization results obtained for film poled using various parameter combinations. A voltage produced by the pyroelectric effect was measured by increasing the temperature of the poled material which now has a conductive coating on each broad surface, electrically shorting the broad surfaces together, decreasing the temperature of the poled material and then making a measurement of the voltage between the broad surfaces of the film. The pyroelectric coefficient is calculated by the formula $$P = \frac{K\epsilon_o}{d} \left(\frac{V}{\Delta T}\right),$$

where P = pyroelectric coefficient, $\epsilon_o$ = permittivity of free space, K = dielectric constant of the film, d = thickness of the film, V = voltage measured, and $\Delta T$ = temperature change of the film to produce V.

The uniformity of polarization was determined by cyclically impinging 5 to 310 Hz energy upon first one surface and then the other surface of the film. First, the poled film was coated on each broad surface with an approximately 60 nanometer thick aluminum layer. One coated surface was exposed to an infrared lamp through a variable frequency mechanical light chopper that had a 50% duty cycle. The conductive layer facing the infrared source absorbed sufficient radiation to heat the film, thereby producing a pyroelectric signal that could be monitored with a high impedance amplifier. At low chopper frequencies such as 25 Hz the entire 25 micrometer thickness of the film was temperature cycled. At higher frequencies such as 200 Hz the part of the thickness of the film nearest the infrared source was temperature cycled more than the part of the thickness of the film farthest from the infrared source. A phase sensitive detector was connected to the output of the amplifier and the output voltage was measured. Data was taken with the infrared source incident on first one surface of the film and then later on the other surface of the film. Such multiple frequency data for each surface was normalized to the 25 Hz data point for that surface. The difference between the two normalized data points for each frequency (one for each side respectively) was divided by the average of the two normalized data points to provide a Percent Deviation of Responsivity as shown in Table I.

As previously described, at the higher frequencies, the part of the thickness of the film nearest the infrared source was temperature cycled more than the part of the thickness of the film farthest from the infrared source. If the film is uniformly poled throughout its thickness, at higher frequencies the normalized response for the same frequency data point on each side of the film will be the same. However, to the extent the film is nonuniformly poled, at higher frequencies the normalized response for the same frequency data point on each side of the film will deviate from each other. In general, the uniformity data indicates that shorter poling times lead to more uniform polarization.

TABLE I

| Time in Field (Seconds) | Field Strength (K volts/cm) | Film Temperature (° C) | Pyroelectric Coefficient Nanocoulombs/ $cm^2 \cdot °C$ | % Deviation of Responsivity (Nonuniformity) | | | | |
|---|---|---|---|---|---|---|---|---|
| | | | | at 50 Hz | at 100 Hz | at 150 Hz | at 200 Hz | at 250 Hz |
| 96 | 1200 | 120 | 2.14 | 0% | 10% | 17% | 28% | X |
| 78 | 1200 | 120 | 2.12 | 0% | 25% | 50% | 75% | X |
| 7 | 1200 | 120 | 2.25 | 0% | 0% | 4% | 14% | 17% |
| 7 | 1400 | 120 | 2.27 | 0% | 0% | 3% | 10% | X |
| 7 | 1600 | 120 | 2.52 | 0% | 0% | 0% | 5% | 7% |
| 7 | 1800 | 120 | 2.67 | 0% | 2% | 4% | 6% | 4% |
| 7 | 2000 | 120 | 2.69 | 0% | 0% | 3% | 3% | 6% |
| 7 | 2200 | 120 | 2.72 | 0% | 0% | 4% | 8% | 11% |

X = no data point taken

EXAMPLE 2

An uncoated 25 micrometer thick, 305 millimeter wide film 31 of biaxially orientated polyvinylidene fluoride was fed through the poling machine shown in FIG. 2. The preheat roller 32 was 95 millimeters in diameter and its temperature was held at approximately 130° C. The conductive roller 35 was 140 millimeters in diameter and heated to approximately 110° C. The roller 33 included an inner conductive roller 37 that was 140 millimeters in diameter and heated to approximately 110° C. This conductive roller was coated with a layer 36 of conductive rubber approximately 3 millimeters thick having an electrical resistivity of approximately $10^{10}$ ohm-cm. The drive rollers 34 were 50 millimeters in diameter. The film was driven through the machine 30 at discrete speeds. Table II shows tabulations of pyroelectric coefficient and uniformity of polarization for film poled using this machine.

TABLE II

| Time in Field (Seconds) | Field Strength (K volts/cm) | Film Temperature (° C) | Pyroelectric Coefficient Nanocoulombs/ $cm^2 \cdot °C$ | % Deviation of Responsivity (Nonuniformity) | | | | |
|---|---|---|---|---|---|---|---|---|
| | | | | at 50 Hz | at 100 Hz | at 150 Hz | at 200 Hz | at 250 Hz |
| 4 | 2800 | 110 | 2.30 | X | X | X | X | X |
| 2 | 2800 | 110 | 2.30 | 0% | 9% | 14% | 24% | X |

X = no data taken

EXAMPLE 3

A 25 micrometer thick, 305 millimeter wide film 20 of biaxially orientated polyvinylidene fluoride was vapor coated with an approximately 60 nanometer thick aluminum layer 21 on one side and then fed through the poling machine 50 shown in FIG. 4. The preheat roller 52, grounded roller 53 and drive rollers 54 were the same as the rollers 11, 14 and 15 described in Example 1. The roller 55 was the same as the roller 12 of Example 1 except that roller 55 was maintained at approximately 23° C. An infrared lamp 56 focused a narrow beam of radiation across the width of the film as it advanced around the roller 55. Table III shows tabulations of pyroelectric coefficient and uniformity of polarization for film poled using this machine.

TABLE III

| Time in Field (Seconds) | Field Strength (K volts/cm) | Roller 55 Temperature (°C) | Estimated Temperature of Heated Area (°C) | Time in Heated Area (Milliseconds) | Pyroelectric Coefficient Nanocoulombs/$cm^2$ °C | % Deviation of Responsivity (Nonuniformity) | | | | |
|---|---|---|---|---|---|---|---|---|---|---|
| | | | | | | at 50 Hz | at 100 Hz | at 150 Hz | at 200 Hz | at 250 Hz |
| 6 | 2400 | 23 | 70 | 100 | 1.96 | X | X | X | X | X |
| 6 | 2400 | 23 | 100 | 100 | 2.34 | 0% | 2% | 1% | 7% | 9% |

X = no data taken

What is claimed is:

1. A poling apparatus for continuously processing a length of film of polymeric material to provide at least one of pyroelectric and piezoelectric properties in the film comprising:
   a first means at a poling station for applying an electric potential to at least a portion of one broad surface of the film;
   a second means located at the poling station for coacting with said first means to establish an electric field greater in magnitude than 1000 K volts/cm across said portion of the film;
   current limiting means carried by said second means for interposition between said second means and said portion of said film while said film is in said poling station; and
   a drive means for continuously advancing the film past the poling station at such speed that said portion of the film is in the influence of said electric field for a period of time less than 180 seconds whereby the magnitude of said electric field for said period of time is sufficient to provide said portion of said film with at least a moderate coefficient of at least one of said pyroelectric and piezoelectric properties.

2. An apparatus according to claim 1, wherein said electric field is greater than 1400 K volts/cm and said portion is in the influence of said electric field for less than 60 seconds.

3. An apparatus according to claim 1, wherein said electric field is greater than 1400 K volts/cm and said portion is in the influence of said electric field for less than 30 seconds.

4. An apparatus according to claim 1, wherein said electric field is greater than 2000 K volts/cm and said portion is in the influence of said electric field for less than 10 seconds.

5. An apparatus according to claim 1, wherein said electric field is greater than 2000 K volts/cm and said portion is in the influence of said electric field for less than 1 second.

6. An apparatus according to claim 1, wherein said second means includes a cylindrical roller having an electrically conductive surface on which said current limiting means is carried.

7. An apparatus according to claim 6, wherein said first means includes a cylindrical roller having a grounded electrically conductive surface for contacting a layer of conductive material carried on said one surface of the film.

8. An apparatus according to claim 7, wherein said second means provides heat for raising the temperature of at least a segment of said portion during the time said segment is influenced by said electric field.

9. An apparatus according to claim 7, further including a radiant heat source that provides heat for raising the temperature of at least a segment of said portion during the time said segment is influenced by said electric field, and wherein said second means provides cooling to said film more than coextensively with said segment.

10. An apparatus according to claim 6, wherein said first means includes a cylindrical roller having a grounded electrically conductive surface for contacting said portion on said one surface of the film.

11. An apparatus according to claim 10, wherein at least one of said first and second means provides heat for raising the temperature of at least a segment of said portion during the time said segment is influenced by said electric field.

12. A poling apparatus for continuously processing a length of film of polymeric material to provide at least one of pyroelectric and piezoelectric properties in the film, comprising:
   a first means at a poling station for applying an electric potential to at least a portion of one broad surface of the film;
   a second means located at the poling station for coacting with said first means to establish an electric field across said portion that approaches the dielectric breakdown strength of the film;
   current limiting means carried by said second means for interposition between said second means and said portion of said film while said film is in said poling station; and
   a drive means for continuously advancing the film past the poling station at such speed that said portion of the film is in the influence of said electric field for a period of time less than 180 seconds whereby the magnitude of said electric field for said period of time is sufficient to provide said portion of said film with at least a moderate coefficient of at least one of said pyroelectric and piezoelectric properties.

13. A poling apparatus according to claim 12, wherein said first and second means establish an electric field that approaches the dielectric breakdown strength of the film for providing considerable coefficients of at least one of said pyroelectric and piezoelectric properties in said portion.

14. A poling apparatus according to claim 12, wherein said first and second means establish an electric field that approaches the dielectric breakdown strength of the film for providing substantial coefficients of at least one of said pyroelectric and piezoelectric properties in said portion.

15. A process for continuously poling a film of polymeric material to provide at least one of pyroelectric and piezoelectric properties in the film, which process comprises the steps of:

applying a first electric potential to one side of a portion of the film at a poling station;

applying a second electric potential to the opposite side of said portion to establish an electric field greater in magnitude than 1000 K volts/cm across said portion of said film; and advancing said film through said electric field at such speed that said portion of the film is in the influence of said electric field for a period of time less than 180 seconds whereby the magnitude of said electrical field for said period of time is sufficient to provide said portion of said film with at least a moderate coefficient of at least one of said pyroelectric and piezoelectric properties.

16. A continuous poling process according to claim 15, wherein said electric field is greater than 1400 K volts/cm and said portion is in the influence of said electric field for less than 60 seconds.

17. A continuous poling process according to claim 15, wherein said electric field is greater than 1400 K volts/cm and said portion is in the influence of said electric field for less than 30 seconds.

18. A continuous poling process according to claim 15, wherein said electric field is greater than 2000 K volts/cm and said portion is in the influence of said electric field for less than 10 seconds.

19. A continuous poling process according to claim 15, wherein said electric field is greater than 2000 K volts/cm and said portion is in the influence of said electric field for less than 1 second.

20. A process according to claim 15, wherein said film is polyvinylidene fluoride.

21. A continuous poling process according to claim 15, further including the steps of:
heating said portion concurrent with the establishment of the electric field across said portion; and
cooling said portion while said polymeric material has moderate coefficients of at least one of pyroelectric and piezoelectric properties produced by said electric field.

22. Poling process according to claim 15 wherein the magnitude of said electrical field approaches the dielectric breakdown strength of said film.

23. The poling process of claim 15 wherein considerable coefficients of at least one of said pyroelectric and piezoelectric properties are provided.

24. The poling process of claim 15 wherein substantial coefficients of at least one of said pyroelectric and piezoelectric properties are provided.

25. A poling apparatus for continuously processing a length of film of polymeric material to provide at least one of pyroelectric and piezoelectric properties in the film, comprising:

a first means at a poling station for applying an electric potential to at least a portion of one broad surface of the film;

a second means located at the poling station for coacting with said first means to establish an electric field greater than 1000 K volts/cm across said portion of the film;

drive means for continuously advancing the film past the poling station between said first and second means at a predetermined rate such that said portion of said film is in the influence of said electric field for less than 180 seconds;

heating means for heating at least said portion of said film such that said portion of said film is at a predetermined temperature above 20° C. in said poling station;

current limiting means carried by said second means for interposition between said second means and said portion of said film while said film is in said poling station; and said first and second means, said heating means, said current limiting means and said drive means coacting to subject said portion of said film to an electrical field greater than 1000 K volts/cm for a time less than 180 seconds and at a temperature above 20° C. sufficient to provide at least a moderate coefficient of at least one of said pyroelectric and piezoelectric properties to said portion of said film.

26. A process for continuously poling a film of polymeric material to provide at least one of pyroelectric and piezoelectric properties in the film, which process comprises the steps of:

applying a first electric potential to one side of a portion of the film at a poling station;

applying a second electric potential to the opposite side of said portion to establish an electric field greater in magnitude than 1000 K volts/cm across said portion of said film;

contacting said portion of said film with current limiting means during the application of said electric field;

heating said portion of said film to a temperature above 20° C. during application of said electric field; and advancing said film through said electric field at such speed that said portion of the film is in the influence of said electric field for a period of time less than 180 seconds whereby the magnitude of said electrical field for said period of time is sufficient to provide said portion of said film with at least a moderate coefficient of at least one of said pyroelectric and piezoelectric properties.

* * * * *